(12) United States Patent
Kost et al.

(10) Patent No.: US 7,436,918 B2
(45) Date of Patent: Oct. 14, 2008

(54) OUTPUT STAGE SYNCHRONIZATION

(75) Inventors: Michael A. Kost, Austin, TX (US); Jack B. Andersen, Austin, TX (US)

(73) Assignee: D2Audio Corporation, Austin, TX (US)

( * ) Notice: Subject to any disclaimer, the term of this patent is extended or adjusted under 35 U.S.C. 154(b) by 768 days.

(21) Appl. No.: 10/805,589

(22) Filed: Mar. 19, 2004

(65) Prior Publication Data

US 2004/0184572 A1     Sep. 23, 2004

Related U.S. Application Data (60) Provisional application No. 60/469,787, filed on May 12, 2003, provisional application No. 60/456,414, filed on Mar. 21, 2003, provisional application No. 60/456,430, filed on Mar. 21, 2003, provisional application No. 60/456,429, filed on Mar. 21, 2003, provisional application No. 60/456,421, filed on Mar. 21, 2003, provisional application No. 60/456,422, filed on Mar. 21, 2003, provisional application No. 60/456,428, filed on Mar. 21, 2003, provisional application No. 60/456,420, filed on Mar. 21, 2003, provisional application No. 60/456,427, filed on Mar. 21, 2003.

(51) Int. Cl.
*H04L 7/00* (2006.01)

(52) U.S. Cl. .................. 375/355; 375/354; 375/357; 375/359; 375/372

(58) Field of Classification Search ............... 375/355, 375/372, 354, 357, 359
See application file for complete search history.

(56) References Cited

U.S. PATENT DOCUMENTS

| 4,121,058 | A | | 10/1978 | Jusko et al. |
| 4,700,391 | A | | 10/1987 | Leslie, Jr. et al. |
| 5,602,878 | A | * | 2/1997 | Cross ......................... 375/354 |
| 5,642,387 | A | * | 6/1997 | Fukasawa .................. 375/372 |
| 6,014,055 | A | | 1/2000 | Chester |
| 6,748,497 | B1 | * | 6/2004 | Kang et al. ................. 711/137 |
| 6,970,435 | B1 | * | 11/2005 | Buchanan et al. .......... 370/278 |

FOREIGN PATENT DOCUMENTS

GB       2200817 A       8/1988

* cited by examiner

*Primary Examiner*—Ted Wang
(74) *Attorney, Agent, or Firm*—Law Offices of Mark L. Berrier (57) ABSTRACT

Systems and methods for transferring data across clock domains in a manner that avoids metastability of the data and is very tolerant of variations in the clock signals of the different clock domains. One embodiment of the invention comprises a mechanism for passing data from a first clock to a second clock domain in a digital pulse width modulated (PWM) amplification system. In this embodiment, parallel data is generated in the process of converting PCM data to PWM data. The parallel data is processed in a clock domain having a first clock rate and is passed to a second clock domain having a clock rate that is twice the rate of the first clock domain. The parallel data is then serialized at the higher clock rate of the second clock domain.

9 Claims, 4 Drawing Sheets

OUTPUT STAGE SYNCHRONIZATION

RELATED APPLICATIONS

This application claims priority to U.S. Provisional Patent Application No. 60/469,787, entitled "PWM Output Stage Synchronization," by Michael A. Kost, et al., filed May 12, 2003; U.S. Provisional Patent Application No. 60/456,414, entitled "Adaptive Anti-Clipping Protection," by Taylor, et al., filed Mar. 21, 2003; U.S. Provisional Patent Application No. 60/456,430, entitled "Frequency Response Correction," by Taylor, et al., filed Mar. 21, 2003; U.S. Provisional Patent Application No. 60/456,429, entitled "High-Efficiency, High-Performance Sample Rate Converter," by Andersen, et al., filed Mar. 21, 2003; U.S. Provisional Patent Application No. 60/456,421, entitled "Output Device Switch Timing Correction," by Taylor, et al., filed Mar. 21, 2003; U.S. Provisional Patent Application No. 60/456,422, entitled "Output Filter, Phase/Timing Correction," by Taylor, et al., filed Mar. 21, 2003; U.S. Provisional Patent Application No. 60/456,428, entitled "Output Filter Speaker/Load Compensation," by Taylor, et al., filed Mar. 21, 2003; U.S. Provisional Patent Application No. 60/456,420, entitled "Output Stage Channel Timing Calibration," by Taylor, et al., filed Mar. 21, 2003; U.S. Provisional Patent Application No. 60/456,427, entitled "Intelligent Over-Current, Over-Load Protection," by Hand, et al., filed Mar. 21, 2003; each of which is fully incorporated by reference as if set forth herein in its entirety.

BACKGROUND OF THE INVENTION

1. Field of the Invention

The invention relates generally to audio amplification systems, and more particularly to systems and methods for transferring data across clock domains, wherein the data transfer is tolerant of variations in the clock signals of the different clock domains.

2. Related Art

Pulse Width Modulation (PWM) or Class D signal amplification technology has existed for a number of years. PWM technology has become more popular with the proliferation of Switched Mode Power Supplies (SMPS). Since this technology emerged, there has been an increased interest in applying PWM techniques in signal amplification applications as a result of the significant efficiency improvement that can be realized through the use of Class D power output topology instead of the legacy (linear Class AB) power output topology.

Early attempts to develop signal amplification applications utilized the same approach to amplification that was being used in the early SMPS. More particularly, these attempts utilized analog modulation schemes that resulted in very low performance applications. These applications were very complex and costly to implement. Consequently, these solutions were not widely accepted. Prior art analog implementations of Class D technology have therefore been unable to displace legacy Class AB amplifiers in mainstream amplifier applications.

Recently, digital PWM modulation schemes have surfaced. These schemes use Sigma-Delta modulation techniques to generate the PWM signals used in the newer digital Class D implementations. These digital PWM schemes, however, did little to offset the major barriers to integration of PWM modulators into the total amplifier solution. Class D technology has therefore continued to be unable to displace legacy Class AB amplifiers in mainstream applications.

One of the problems that exists in PWM amplifier systems is that the generation of PWM signals is relatively slow. In one system, for example, a PWM amplifier is implemented using a digital signal processor (DSP) that operates at 150 MHz. It may, however, be desirable to provide output at a higher rate than 150 MHz. Because the this conversion from the lower rate (150 MHz) to the higher rate (e.g., 300 MHz) involves audio data, it must be performed in real time in order to provide acceptable performance.

Another problem with existing systems is that it is typically very difficult to cross from one clock domain to another without having to use very precise tolerances.

If manufactured devices are not within these tolerances, the clock signals in the different domains may vary and cause the domain crossing mechanism to fail. Variations in the clock signals may arise from changes in temperature, drifting voltages, noise, and the like. If the clock signals vary enough, the data that is passed from one domain to another may be corrupted.

It would therefore be desirable to provide a mechanism for transferring data from one clock domain to another in a manner that does not require very strict tolerances, but is adaptable to variations in the clock signals of the different clock domains.

SUMMARY OF THE INVENTION

One or more of the problems outlined above may be solved by the various embodiments of the invention. Broadly speaking, the invention comprises systems and methods for transferring data across clock domains in a manner that avoids metastability of the data and is very tolerant of variations in the clock signals of the different clock domains. One embodiment of the invention comprises a mechanism for passing data from a first clock to a second clock domain in a digital pulse width modulated (PWM) amplification system. In this embodiment, parallel data is generated in the process of converting PCM data to PWM data. The parallel data is processed in a clock domain having a first clock rate and is passed to a second clock domain having a clock rate that is twice the rate of the first clock domain. The parallel data is then serialized at the higher clock rate of the second clock domain.

In one embodiment, the clock domain crossing mechanism is implemented using two sets of flip-flops. One of the sets of flip-flops is operated in the first clock domain, while the other set is operated in the second clock domain. Data is stored in the first set of flip-flops according to the clock signal of the first clock domain. Data is read out of each of these flip-flops several cycles after the data is stored in the flip-flop. This allows the data value to stabilize before being read. The data that is read out of each flip-flop in the first set is stored in a corresponding flip-flop of the second set. The data is then read out of the second set of flip-flops according to the clock signal of the second domain. The first and second sets of flip-flops are operated in accordance with a state machine that synchronizes their operation. The state machine controls the storing of the data in the flip-flops and the reading of the data out of the flip-flops so that the delay between the storing of a bit in a flip-flop and the reading of that bit out of the flip-flop falls within a desired range. This delay may vary, depending upon a number of factors, such as the mismatch of the clock rates (i.e., when the second clock rate is not exactly twice the first clock rate), clock rate differences due to manufacturing tolerances, changes in clock rates due to temperature changes, and so on. If the delay is too short, the state machine reads an additional flip-flop (or effectively re-reads one of the flip-flops) in order to increase the delay. If the delay is too long, the state machine skips one of the flip-flops in order to decrease the delay. The system thereby adds bits to the data stream or deletes bits from the data stream to maintain synchronization of the clock domain crossing mechanism. The periodic addition or deletion of data bits in this manner does not create an appreciable distortion of the audio signal.

One embodiment comprises a system having a first set of storage locations, a second set of storage locations, and control logic configured to manage the transfer of data from the first set to the second set of storage locations. The control logic loads data from a plurality of parallel data streams received according to a first clock signal having a first rate into the first set of storage locations, allows values of the data to stabilize in the first set of storage locations, and then loads data from the first set of storage locations to the second set of storage locations. The control logic then reads data from the second set of storage locations according to a second clock signal having a rate that is different from the rate of the first clock signal. The control logic determines a delay between data being loaded into the first set of storage locations and the same data being loaded into the second set of storage locations and then selectively adds or drops data to maintain the delay in a predetermined range.

Another embodiment comprises a method, including the steps of loading data received according to a first clock signal having a first rate into a first set of storage locations according to a first clock signal, allowing values of the data to stabilize in the first set of storage locations, loading data from the first set of storage locations to a second set of storage locations, reading data from the second set of storage locations according to a second clock signal having a second rate that is different from the first rate, determining a delay between each data bit being loaded into the first set of storage locations and the data bit being loaded into the second set of storage locations, and selectively adding or dropping data to maintain the delay in a predetermined range.

Numerous additional embodiments are also possible.

BRIEF DESCRIPTION OF THE DRAWINGS

Other objects and advantages of the invention may become apparent upon reading the following detailed description and upon reference to the accompanying drawings.

While the invention is subject to various modifications and alternative forms, specific embodiments thereof are shown by way of example in the drawings and the accompanying detailed description. It should be understood, however, that the drawings and detailed description are not intended to limit the invention to the particular embodiment which is described. This disclosure is instead intended to cover all modifications, equivalents and alternatives falling within the scope of the present invention as defined by the appended claims.

DETAILED DESCRIPTION OF PREFERRED EMBODIMENTS

One or more embodiments of the invention are described below. It should be noted that these and any other embodiments described below are exemplary and are intended to be illustrative of the invention rather than limiting.

As described herein, various embodiments of the invention comprise systems and methods for transferring data across clock domains in a manner that avoids metastability of the data and is very tolerant of variations in the clock signals of the different clock domains. One embodiment of the invention comprises a mechanism for passing data from a first clock to a second clock domain in a digital pulse width modulated (PWM) amplification system. In this embodiment, parallel data is generated in the process of converting PCM data to PWM data. The parallel data is processed in a clock domain having a first clock rate and is passed to a second clock domain having a clock rate that is twice the rate of the first clock domain. The parallel data is then serialized at the higher clock rate of the second clock domain.

In one embodiment, the clock domain crossing mechanism is implemented using two sets of flip-flops. One of the sets of flip-flops is operated in the first clock domain, while the other set is operated in the second clock domain. Data is stored in the first set of flip-flops according to the clock signal of the first clock domain. Data is read out of each of these flip-flops several cycles after the data is stored in the flip-flop. This allows the data value to stabilize before being read. The data that is read out of each flip-flop in the first set is stored in a corresponding flip-flop of the second set. The data is then read out of the second set of flip-flops according to the clock signal of the second domain.

The first and second sets of flip-flops are operated in accordance with a state machine that synchronizes their operation. The state machine controls the storing of the data in the flip-flops and the reading of the data out of the flip-flops so that the delay between the storing of a bit in a flip-flop and the reading of that bit out of the flip-flop falls within a desired range. This delay may vary, depending upon a number of factors, such as the mismatch of the clock rates (i.e., when the second clock rate is not exactly twice the first clock rate), clock rate differences due to manufacturing tolerances, changes in clock rates due to temperature changes, and so on. If the delay is too short, the state machine reads an additional flip-flop (or effectively re-reads one of the flip-flops) in order to increase the delay. If the delay is too long, the state machine skips one of the flip-flops in order to decrease the delay. The system thereby adds bits to the data stream or deletes bits from the data stream to maintain synchronization of the clock domain crossing mechanism. The periodic addition or deletion of data bits in this manner does not create an appreciable distortion of the audio signal.

In one embodiment, the clock signal of the second clock domain has a rate that is twice the rate of the cock signal in the first clock domain. In this embodiment, the data input to the clock domain crossing subsystem comprises two parallel data streams. For each bit in one of the data streams, there is a corresponding bit in the other data stream. Corresponding bits from each stream are stored in the flip-flops in parallel. When the data is read from the first set of flip-flops and stored in the second set of flip-flops, the data is read and as stored pairs of corresponding bits. When the data is read out of the second set of flip-flops, the bits are serially read out of the flip-flops to produce a single data stream at twice the rate of the two parallel data streams. In the event that the output stage of the audio amplifier in which this mechanism is implemented needs to be operated at a lower rate, the data bits corresponding to one of the data streams input to the clock domain crossing mechanism can be discarded and the data read out of the second set of flip-flops at the same clock rate at which the data is stored in the first set of flip-flops.

This clock domain crossing mechanism may provide a number of advantages over the prior art. For example, by enabling the output data rate to be greater than the DSP rate, greater resolution on the output is possible. Another possible advantage is the ability of the mechanism to enable the use of less stringent manufacturing tolerances and to adapt to relatively large changes in the clock signals of the different clock domains. Still another potential advantage is the ability to shift from the higher output rate (e.g., twice the input rate) to a lower output rate (e.g., equal to the input rate).

Figure 1:
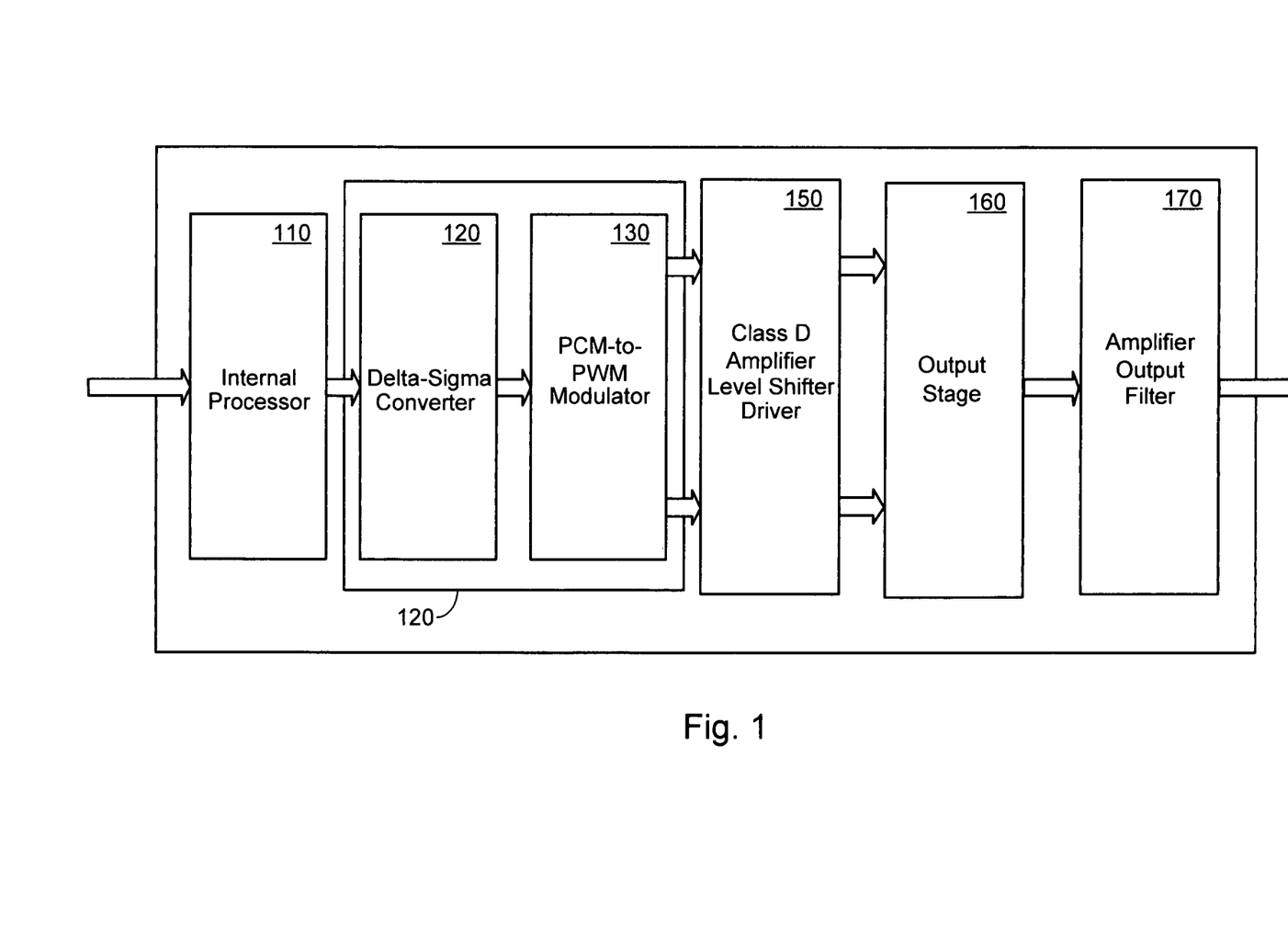
FIG. 1 is a a functional block diagram illustrating a PWM amplifier in accordance with one embodiment.

One embodiment of the present clock domain crossing mechanism is implemented in a digital PWM amplifier. Referring to FIG. 1, a functional block diagram illustrating a PWM amplifier in accordance with one embodiment is shown. As depicted in the figure, PWM amplifier 100 comprises an internal processor 110, a delta-sigma converter 120, a PCM-to-PWM modulator 130, a Driver 150, an output stage 160 and an output filter 170. Delta-sigma converter 120 and PCM-to-PWM modulator 130 form a Class D modulator 140.

A digital audio signal is first input to internal processor 110. Internal processor 110 performs audio processing on the digital audio signal. The internal processor 110 may perform various types of processing on the signal. The processed digital audio signal is then converted to a 1-bit digital data stream by Class D modulator 140. This 1-bit data stream is characterized by two control signals that are output to driver 150, which then uses the signals to drive the upper and lower switches of output stage 160. The signal produced by output stage 160 is then processed by output filter 170. The signal output by filter 170 can then be used to drive a speaker system (not shown).

As indicated above, in one embodiment, class D modulator 140 is implemented in a DSP. In this embodiment, the DSP operates at a clock rate of 150 MHz. This clock rate is not sufficient to support the desired resolution in the audio output signal, so it is necessary to provide a means for producing audio output data at a higher rate. In particular, the present clock domain crossing mechanism is provided to enable the output of the audio data at 300 MHz (twice the DSP rate of 150 MHz). This mechanism is implemented at the output of class D modulator 140.

Figure 2:
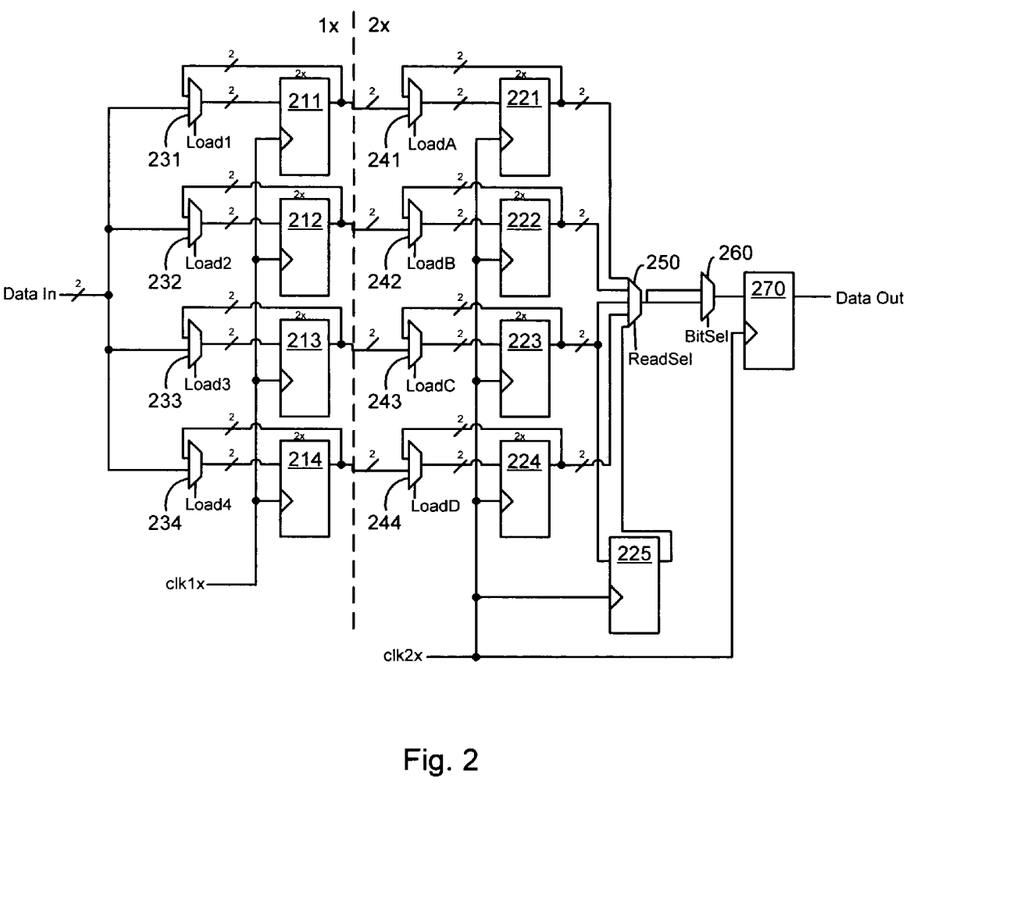
FIG. 2 is a diagram illustrating the structure of the clock domain crossing subsystem in accordance with one embodiment.

Referring to FIG. 2, a diagram illustrating the structure of the clock domain crossing subsystem in accordance with one embodiment of the invention is shown. As depicted in this figure, the subsystem comprises a first set of flip-flops 211-214, a second set of flip-flops 221-225, corresponding multiplexers 231-234 and 241-244, a read select multiplexer 250, a bit select multiplexer 260 and an output flip-flop 270. The clock domain crossing subsystem illustrated here is configured to handle two-bit-wide input data (two parallel data streams at a first rate) and to generate a single data stream containing the interleaved bits of the two input data streams.

Flip-flops 211-214 reside in a first clock domain and are clocked by a first clock signal. The first clock signal has a first clock rate, which in this instance is 150 MHz. Flip-flops 221-225 reside in a second clock domain and are clocked by a second clock signal. The second clock signal has a second clock rate which is 300 MHz in this embodiment.

Two-bit parallel data is input to the clock domain crossing subsystem and is coupled as an input to each of multiplexers 231-234. Each of multiplexers 231-234 also has as an input which is coupled to the output of the corresponding one of flip-flops 211-214. A separate load signal is provided to each of multiplexers 231-234. The output of each of multiplexers 231-234 is provided as an input to the corresponding one of flip-flops 211-214. Flip-flops 211-214 are clocked by the first clock signal.

It should be noted that, with the exception of multiplexer 260 and flip-flop 270, each of the multiplexers and flip-flops described in connection with FIG. 2 is 2 bits wide to handle the parallel data streams described above.

The output of each of flip-flops 211-214 is provided as an input to a corresponding one of multiplexers 241-244 (in addition to being provided as an input to the corresponding one of multiplexers 231-234). Each of multiplexers 241-244 also has a second input that is coupled to the output of the corresponding one of flip-flops 221-224. Each of multiplexers 241-244 has a load signal that is separate from the other multiplexers (including 231-234 and 241-244). The output of each of multiplexers 231-234 is provided as an input to a corresponding one of flip-flops 221-224. Flip-flops 221-224 are clocked by the second clock signal.

In this embodiment, the second set of flip-flops includes a fifth flip-flop 225. The input of flip-flop 225 is coupled to the output of flip-flop 223. Flip-flop 225 is clocked by the second clock signal. The outputs of each of flip-flops 221-225 are provided as inputs to multiplexer 260. Multiplexer 250 also has a select input that is used to select which of the inputs (each from a different flip-flop) is provided at the output of the multiplexer.

As noted above, the data handled by flip-flops 211-214 and 221-225 and multiplexers 231-234 and 241-244 is two bits wide. The input and output of multiplexer 250 are also two bits wide. The two bits that are output by multiplexer 250 are provided as separate inputs to multiplexer 260. Multiplexer 260 also has a select input. The signal at the select input to multiplexer 260 determines which of the two bits at the input of the multiplexer is selected to be provided as the output of the multiplexer. The output of multiplexer 260 is then provided as an input of flip-flop 270.

The clock domain crossing subsystem described in connection with FIG. 2 operates essentially as follows. The input data (which is two bits wide) is input to each of multiplexers 231-234. The load signals input to multiplexers 231-234 are sequentially asserted to load the data into flip-flops 211-214 in round robin fashion. In other words, flip-flop 211 will be loaded, then flip-flop 212, then flip-flop 213, then flip-flop 214, then flip-flop 211, and so on. When the load signal for a particular flip-flop is not asserted, the corresponding multiplexer reloads the current value of the flip-flop back into the flip-flop.

The data stored in each of the first set of flip-flops (211-214) is then loaded into the corresponding one of the second set of flip-flops (221-224). Flip-flops 221-224 are again loaded in round robin fashion, but the flip-flops of the second set are loaded with data several cycles after the data is loaded into the first set of flip-flops. That is, a bit of data is loaded into a flip-flop in the first set, and then several clock cycles later, the data from the flip-flop in the first set is loaded into the corresponding flip-flop in the second set. The several-cycle delay allows the value of the data to stabilize in the first-set flip-flop and prevents problems with metastability in the first-set flip-flop.

The data is then read out of the flip-flops of the second set. This is done primarily in a round robin fashion similar to the manner in which the data is stored in the flip-flops. This may, however, be adjusted to account for variations in a second clock signal relative to the first clock signal. More specifically, if the clock rate of the second clock signal speeds up relative to the first clock signal, it will read data out of the second set of flip-flops too quickly. Multiplexer 250 will therefore be controlled to read data from the additional flip-flop, 225, therefore continuing to read data from flip-flops 221-224 in order to effectively slow down the rate at which data is read from the second set of flip-flops. Similarly, if the clock rate of the second clock signal slows down relative to the first clock signal, data will be read out of the second set of flip-flops too slowly. Multiplexer 250 will therefore be controlled to skip one of flip-flops 221-224 in order to allow the effective rate at which data is read out of the flip-flops to "catch-up" with the rate at which data is stored in the flip-flops. The control mechanism for reading data out of the flip-flops (including skipping flip-flops or reading additional flip-flops) will be discussed in more detail below.

The data which is read out of flip-flops 221-224 is provided at the output of multiplexer 250. As noted above, this output consists of a pair of bits from the parallel data streams that are input to the clock domain crossing subsystem. These parallel bits are provided as inputs to multiplexer 260. A bit select signal which is input to multiplexer 260 determines which of the bits is provided to flip-flop 270, which then provides the selected bit as part of an output data stream. In normal operation, the bit select signal alternates between the two bits, so that they are interleaved in the output data stream. In other words, multiplexer 260 will select a first bit of the data stored in flip-flop 221, and then the second bit of the data stored in this flip-flop. Multiplexer 250 then selects the next flip-flop, 222, after which multiplexer 260 will select the first bit of flip-flop 222 and then the second bit of flip-flop 222, and so on.

In this embodiment, the clock domain crossing subsystem provides a means for slowing down the output data rate. This is accomplished by setting the bit select signal which is input to multiplexer 260 to select one bit or the other, rather than alternating between bits. In this manner, the clock domain crossing subsystem can select only the first bits (or only the second bits) of each flip-flop and can output these bits at half of the normal output data rate. Thus, rather than moving the data from a 1× clock domain to a 2× clock domain, the data is effectively moved from a 1× clock domain to another 1× clock domain. By stripping away half of the bits in this manner, the clock domain crossing subsystem allows the DSP to continue operating at the same rate, rather than having to slow down the DSP in order to achieve a reduced output data rate. This may be important because it may be necessary to operate the DSP at the higher rate in order to perform all of the processing that is necessary.

Figure 3:
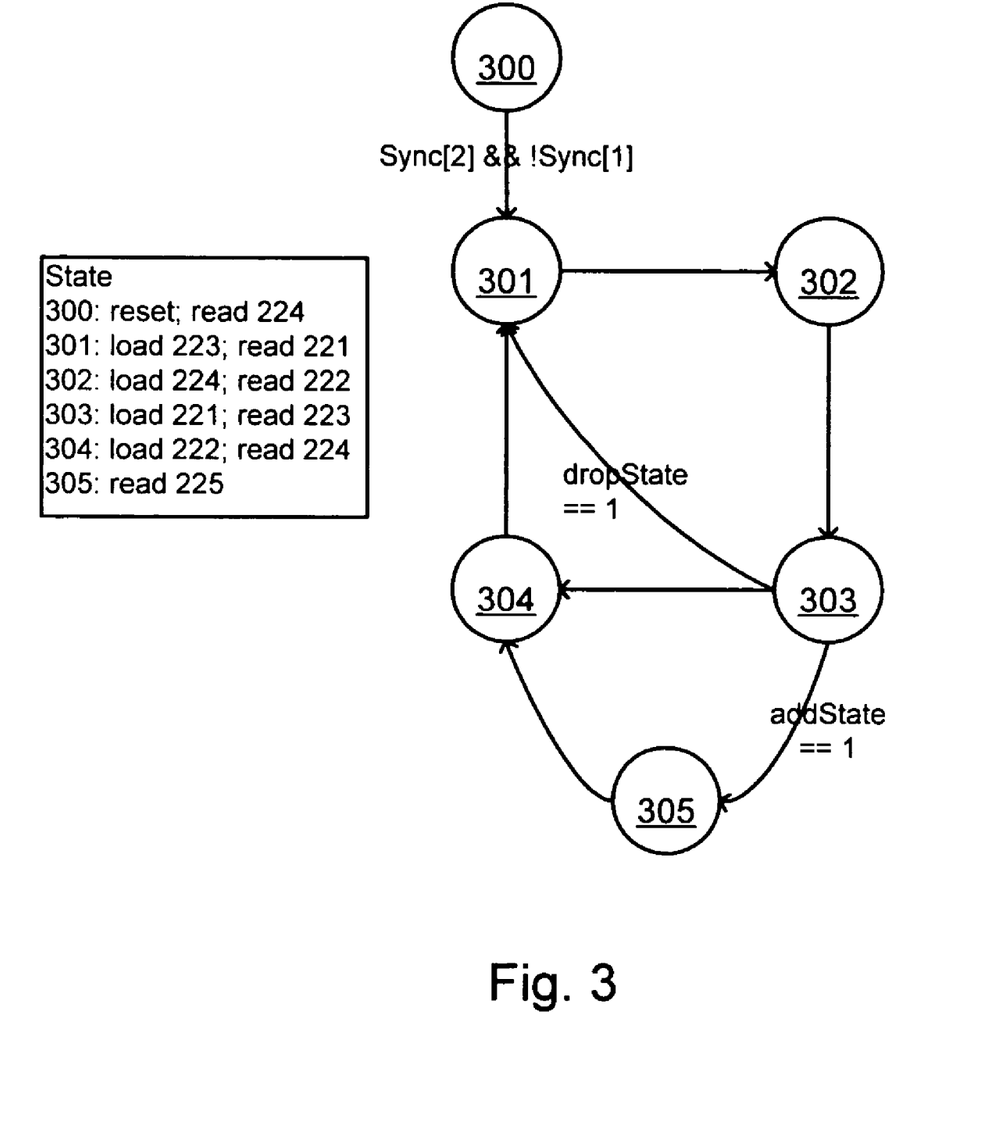
FIG. 3 is a state diagram illustrating the manner in which data is loaded into and read from the second set of flip-flops in accordance with one embodiment.

Referring to FIG. 3, a state diagram illustrating the manner in which data is loaded into and read from the second set of flip-flops in the clock domain crossing subsystem is shown. As depicted in this figure, the clock domain crossing subsystem begins operation at state 300. In this state, none of the load signals for the second set of flip-flops is asserted, and the read select signal is set to read from flip-flop 224. The clock domain crossing subsystem returns to this state upon reset. From state 300, the state machine moves to state 301, in which the load signal for flip-flop 223 is asserted, and the read select signal is set to read from flip-flop 221. From state 301, the state machine moves to state 302, in which the load signal for flip-flop 224 is asserted, and the read select signal is set to read from flip-flop 222. From state 302, the state machine moves to state 303, in which the load signal for flip-flop 221 is asserted, and the read select signal is set to read from flip-flop 223.

From state 303, the state machine may move to any of three states: 304; 305 or 301. If the second clock signal has not shifted with respect to the first clock signal, the state machine will move from state 303 to state 304. In state 304, the load signal for flip-flop 222 is asserted, and the read select signal is set to read from flip-flop 224. If, however, the clock signals have shifted with respect to each other, the state machine will move from state 303 to either state 305 or state 301. If the second clock signal has shifted so that its rate has effectively increased, it is necessary to delay the reading of the second set of flip-flops, so the state machine moves to state 305, in which no load signal is asserted and the read select signal is set to read from flip-flop 225. If, on the other hand, the second clock signal has shifted so that its rate has effectively decreased, it is necessary to "speed up" the reading of the second set of flip-flops. The state machine therefore skips state 304 and moves directly to state 301.

As noted above, flip-flops 221-224 should be loaded several cycles (e.g., approximately 2 cycles in this embodiment) after the corresponding ones of flip-flops 211-214. For example, flip-flop 221 should be loaded about 2 cycles after flip-flop 211, flip-flop 222 should be loaded about 2 cycles after flip-flop 212, and so on. The mechanism provided in this embodiment for implementing this delay makes use of the circuit illustrated in FIG. 4. This figure comprises a block diagram of a circuit for processing the load signals for flip-flops 211-214 to provide input to the state machine illustrated in FIG. 3. After this circuit delays the load signals for the first set of flip-flops, the delayed load signals are checked to see if they fall within a temporal window corresponding to the approximate 2-cycle delay.

Figure 4:
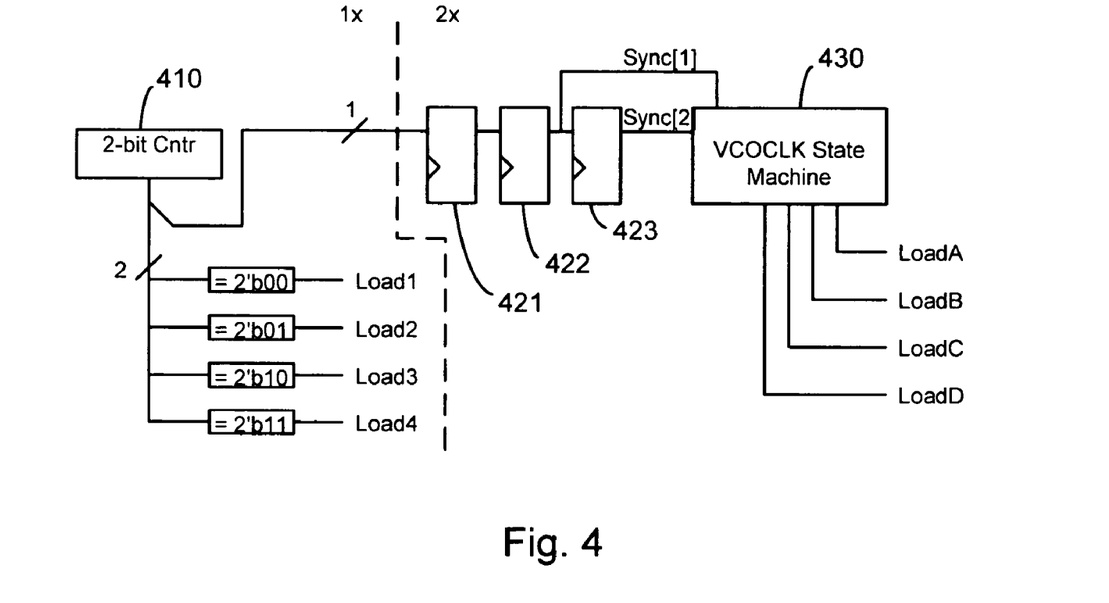
FIG. 4 is a block diagram of a circuit for processing load signals for the first set of flip-flops to provide input to the state machine in accordance with one embodiment.

As depicted in FIG. 4, the load signals for flip-flops 211-214 are input to two-bit counter 410. When the load signal for flip-flop 211 is asserted, the input to flip-flop 421 is asserted. The signal is clocked through flip-flops 421, 422 and/or 423 before being input to state machine 430. The signal is therefore delayed by two or three clock cycles. It can be seen from the figure that a signal having a two-cycle delay is passed from the output of flip-flop 422 to state machine 430, and a signal having a three-cycle delay is passed from the output of flip-flop 423 to state machine 430.

State machine 430 maintains synchronization between the first set of flip-flops and the second set of flip-flops by comparing the current state to the load signals that are received from flip-flop 423. In one embodiment, the state machine 430 begins operation in the reset state, 300. On the next cycle (in state 301), flip-flops 211 and 223 are loaded. When the load signal for flip-flop 211 is asserted, the signal begins propagating through flip-flops 421-423. At state 302, flip-flops 212 and 224 are loaded. At state 303, state machine 430 checks to see if the load signal for flip-flop 211 has been received from flip-flop 423. If the load signal from flip-flop 423 is within the window in which state machine checks for it, then the state machine continues from state 303 to state 304. If the load signal from flip-flop 423 is not within this window, then the state machine adds or skips a state (and consequently adds or skips one of the flip-flops in the second set of flip-flops) by moving to either state 301 or state 305.

If the load signal for flip-flop 211 has not been received from flip-flop 423, the state machine moves from state 303 to state 305 in order to effectively slow down the rate at which the data is read out of the second set of flip-flops. The state machine then moves from state 305 to state 304. If the load signal for flip-flop 211 has been received from flip-flop 423 and the load signal received from flip-flop 422 (which was delayed by two cycles instead of three) is within the window, the state machine moves from state 303 to state 301 in order to effectively speed up the rate at which the data is read out of the second set of flip-flops. After the state machine adds or skips a state, the normal state changes from state 304 to state 301 to state 302 and back to state 303 take place. When state 303 is reached, the state machine again checks to see if the load signal from flip-flop 211 is within the window and selects the appropriate state (301, 304 or 305) to which it will move.

It should be noted that, for the purposes of the foregoing discussion, one of the first set of flip-flops is loaded on each cycle of the first clock signal, while one of the second set of flip-flops is loaded on every other cycle of the second clock signal (which has twice the rate of the first clock signal). It is possible to implement this mechanism in other ways in other embodiments. For example, the data could be transferred from four two-bit flip-flops to eight one-bit flip-flops, and the flip-flops could be read, one per cycle of the respective clock signal. As indicated above, the clock domain crossing subsystem may be configured in one embodiment to strip off every other bit from the single, interleaved data stream, in which case a bit would be read out of one of the second set of flip-flops on each clock cycle. Other variations are possible as well.

Other embodiments may include a number of variations on the embodiments described above. For instance, while one embodiment has a clock rate in the second clock domain that is twice the rate of the clock signal in the first domain, other embodiments may have other multiples between the clock rates (e.g., the second clock rate may be n times the first clock rate. Another alternative embodiment may use a different number of flip-flops to perform the clock domain crossing. In the embodiments described above, four (or four plus one) flip-flops are in each of the first and second sets of flip-flops. Another embodiment may use n (n plus one) flip-flops. In yet another alternative embodiment, the state machine may cause one of the flip-flops to be re-read rather than reading an extra flip-flop (e.g., flip-flop 305) when the second clock signal gets ahead of the first clock signal.

The embodiments described above use flip-flops to store the data that is transferred from one clock domain to the other. Alternative embodiments may use other types of data storage, such as registers, FIFOs or general purpose memory. A "flip-flop," as used above, should therefore be construed to include any type of storage location that could be used to store the data. It should also be noted that the processing performed by the clock domain crossing subsystem may be provided by a general purpose processor, ASIC, FPGA or any other type of data processor, and should not be construed to be limited to the DSP of the embodiments described above.

Those of skill in the art will understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. The information and signals may be communicated between components of the disclosed systems using any suitable transport media, including wires, metallic traces, vias, optical fibers, and the like.

Those of skill will further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Those of skill in the art may implement the described functionality in varying ways for each particular application, but such implementation decisions should not be interpreted as causing a departure from the scope of the present invention.

The various illustrative logical blocks, modules, and circuits described in connection with the embodiments disclosed herein may be implemented or performed with general purpose processors, digital signal processors (DSPs) or other logic devices, application specific integrated circuits (ASICs), field programmable gate arrays (FPGAs), discrete gates or transistor logic, discrete hardware components, or any combination thereof designed to perform the functions described herein. A general purpose processor may be any conventional processor, controller, microcontroller, state machine or the like. A processor may also be implemented as a combination of computing devices, e.g., a combination of a DSP and a microprocessor, a plurality of microprocessors, one or more microprocessors in conjunction with a DSP core, or any other such configuration.

The steps of the methods or algorithms described in connection with the embodiments disclosed herein may be embodied directly in hardware, in software or firmware modules executed by a processor, or in a combination thereof. A software product may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

The benefits and advantages which may be provided by the present invention have been described above with regard to specific embodiments. These benefits and advantages, and any elements or limitations that may cause them to occur or to become more pronounced are not to be construed as critical, required, or essential features of any or all of the claims. As used herein, the terms "comprises," "comprising," or any other variations thereof, are intended to be interpreted as non-exclusively including the elements or limitations which follow those terms. Accordingly, a system, method, or other embodiment that comprises a set of elements is not limited to only those elements, and may include other elements not expressly listed or inherent to the claimed embodiment.

While the present invention has been described with reference to particular embodiments, it should be understood that the embodiments are illustrative and that the scope of the invention is not limited to these embodiments. Many variations, modifications, additions and improvements to the embodiments described above are possible. It is contemplated that these variations, modifications, additions and improvements fall within the scope of the invention as detailed within the following claims.

The invention claimed is:

1. A system comprising:
a first set of storage locations;
a second set of storage locations; and
control logic including a state machine configured to
  load data from a plurality of parallel data streams received according to a first clock signal having a first rate into the first set of storage locations,
  allow values of the data to stabilize in the first set of storage locations,
  load data from the first set of storage locations to the second set of storage locations,
  read data from the second set of storage locations according to a second clock signal having a rate that is different from the rate of the first clock signal,
  determine a delay between data being loaded into the first set of storage locations and the same data being loaded into the second set of storage locations by delaying a load signal corresponding to a selected storage location in the first set by a predetermined amount and determining whether the delayed load signal falls within a temporal window associated with loading a selected storage location in the second set, and
  selectively add or drop data to maintain the delay in a predetermined range delay logic configured to delay a load signal associated with the first set of storage locations and to provide the delayed load signal to the state machine.

2. The system of claim 1, wherein the state machine is configured to selectively add or drop data by: if the delayed load signal falls within the temporal window, reading data sequentially out of the second set of storage locations; if the delayed load signal precedes the temporal window, skipping reading one of the second set of storage locations; and if the delayed load signal follows the temporal window, reading an additional one of the second set of storage locations.

3. A system comprising:
a first set of storage locations, wherein the first set of storage locations comprises four storage locations and wherein each storage location is configured to store a bit from each of parallel data streams;
a second set of storage locations, wherein the second set of storage locations comprises four storage locations corresponding to the storage locations in the first set, and an additional storage location, wherein adding data comprises reading the additional storage location; and
control logic configured to
  load data from a plurality of parallel data streams received according to a first clock signal having a first rate into the first set of storage locations,
  allow values of the data to stabilize in the first set of storage locations,
  load data from the first set of storage locations to the second set of storage locations,
  read data from the second set of storage locations according to a second clock signal having a rate that is different from the rate of the first clock signal,
  determine a delay between data being loaded into the first set of storage locations and the same data being loaded into the second set of storage locations, and
  selectively add or drop data to maintain the delay in a predetermined range.

4. A system comprising:
a first set of storage locations;
a second set of storage locations; and
control logic configured to
  load data from n parallel data streams received according to a first clock signal having a first rate into the first set of storage locations,
  allow values of the data to stabilize in the first set of storage locations,
  load data from the first set of storage locations to the second set of storage locations,
  read data from the second set of storage locations according to a second clock signal having a rate that is different from the rate of the first clock signal and to read data from the second set of storage locations in an interleaved fashion to generate a single serial data stream at the second clock rate and discard every second bit,
  determine a delay between data being loaded into the first set of storage locations and the same data being loaded into the second set of storage locations, and
  selectively add or drop data to maintain the delay in a predetermined range, wherein the second clock rate is n times the first clock rate.

5. A system comprising:
a first set of storage locations;
a second set of storage locations; and
control logic configured to
  load data from a plurality of parallel data streams received according to a first clock signal having a first rate into the first set of storage locations,
  allow values of the data to stabilize in the first set of storage locations,
  load data from the first set of storage locations to the second set of storage locations,
  read data from the second set of storage locations according to a second clock signal having a rate that is different from the rate of the first clock signal and discard every second bit,
  determine a delay between data being loaded into the first set of storage locations and the same data being loaded into the second set of storage locations, and
  selectively add or drop data to maintain the delay in a predetermined range.

6. A method comprising:
loading data received according to a first clock signal having a first rate into a first set of storage locations according to a first clock signal;
allowing values of the data to stabilize in the first set of storage locations;
loading data from the first set of storage locations to a second set of storage locations;
reading data from the second set of storage locations according to a second clock signal having a second rate that is different from the first rate;
determining a delay between each data bit being loaded into the first set of storage locations and the data bit being loaded into the second set of storage locations by delaying a load signal corresponding to a selected storage location in the first set by a predetermined amount and determining whether the delayed load signal falls within a temporal window associated with loading a selected storage location in the second set; and
selectively adding or dropping data to maintain the delay in a predetermined range.

7. The method of claim 6, wherein selectively adding or dropping data to maintain the delay in a predetermined range comprises: if the delayed load signal falls within the temporal window, reading data sequentially out of the second set of storage locations; if the delayed load signal precedes the temporal window, skipping reading one of the second set of storage locations; and if the delayed load signal follows the temporal window, reading an additional one of the second set of storage locations.

8. A method comprising:
loading data received in n parallel data streams according to a first clock signal having a first rate into a first set of storage locations according to a first clock signal;
allowing values of the data to stabilize in the first set of storage locations;
loading data from the first set of storage locations to a second set of storage locations;
reading data from the second set of storage locations according to a second clock signal having a second rate that is n times the first clock rate and interleaving the data from the parallel data streams to generate a single serial data stream at the second clock rate and discarding every second bit;
determining a delay between each data bit being loaded into the first set of storage locations and the data bit being loaded into the second set of storage locations; and
selectively adding or dropping data to maintain the delay in a predetermined range.

9. A method comprising:
loading data received according to a first clock signal having a first rate into a first set of storage locations according to a first clock signal;
allowing values of the data to stabilize in the first set of storage locations;
loading data from the first set of storage locations to a second set of storage locations;
reading data from the second set of storage locations according to a second clock signal having a second rate that is different from the first rate, discarding a portion of the data bits and generating a single serial data stream at a reduced clock rate wherein every second bit is discarded;
determining a delay between each data bit being loaded into the first set of storage locations and the data bit being loaded into the second set of storage locations; and
selectively adding or dropping data to maintain the delay in a predetermined range.

* * * * *